United States Patent [19]

Reeds

[11] Patent Number: 4,532,426
[45] Date of Patent: Jul. 30, 1985

[54] WAFER HEIGHT CORRECTION SYSTEM FOR FOCUSED BEAM SYSTEM

[75] Inventor: John W. Reeds, Thousand Oaks, Calif.

[73] Assignee: Hughes Aircraft Company, El Segundo, Calif.

[21] Appl. No.: 505,563

[22] Filed: Jun. 17, 1983

[51] Int. Cl.³ .............................................. G21K 5/10
[52] U.S. Cl. ................................ 250/442.1; 250/440.1
[58] Field of Search ............... 250/440.1, 442.1, 443.1; 269/56

[56] References Cited

U.S. PATENT DOCUMENTS

| | | | |
|---|---|---|---|
| 3,388,251 | 6/1968 | Grasenick et al. | 250/442.1 |
| 3,649,738 | 3/1972 | Anderson | 250/443.1 |
| 3,678,270 | 7/1972 | Braun et al. | 250/442.1 |
| 4,425,507 | 1/1984 | Panov et al. | 250/442.1 |

Primary Examiner—Bruce C. Anderson
Attorney, Agent, or Firm—A. W. Karambelas

[57] ABSTRACT

Base plate 32 of the wafer support is flexibly mounted with respect to the floor 34 of the target chamber. Flanges 54 and 58 flex by operation of motor 68 to adjust the position of the wafer support with respect to the focal point of the column.

16 Claims, 5 Drawing Figures

WAFER HEIGHT CORRECTION SYSTEM FOR FOCUSED BEAM SYSTEM

BACKGROUND OF THE INVENTION

This invention is directed to a system for adjusting the target with respect to the optics in a focused beam system to place the active surface of the target at the proper point.

When optics focus a beam at a target there may be changes in the system which cause the optimum focal point not to be at the effective surface of the target. For example, if the target is a series of similar devices, the target thickness may differ so that the effective top surface of the target would be at a different position. Of course the optics can be adjusted so that the focal point appears at the surface of the target but in many optical systems the adjustment of the focal length is quite difficult. Such is particularly true in focused electron beam and ion beam systems. Such beams are used for various purposes, including writing patterns on the target or writing patterns on an etch resist material on the target. For such beams, quite often the target is a semiconductor wafer.

SUMMARY OF THE INVENTION

In order to aid in the understanding of this invention it can be stated in essentially summary form that it is directed to a wafer-height correction system for focused beam systems wherein the optics which produce the focused beam are moved as a group toward and away from the target position so that the focal length of the focused beam system is not changed, but the target position with respect to the beam system is changed.

It is a purpose and advantage of this invention to provide a system wherein the position of a wafer in a focused electron or ion beam system can be located at an optimum point on the optical path. It is a further purpose and advantage of this invention to provide a system wherein wafers of different height can be placed in an electron or ion beam system for adjustment of the position of the target with respect to the optics as a unit so that the wafer can be located at the correct focal point of the optical system without changes in the beam system which change its focal length.

Other purposes and advantages of this invention will become apparent from a study of the following portion of this specification, the claims and the attached drawings.

DESCRIPTION OF THE PREFERRED EMBODIMENTS

Figure 1:
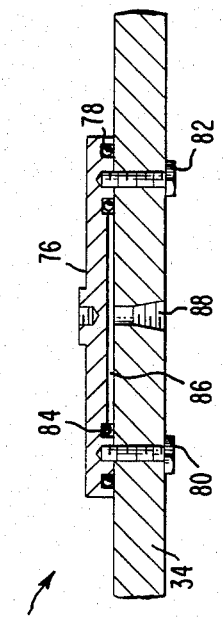
FIG. 1 is a perspective view of a column containing, a beam optical system.

FIG. 1 illustrates a focused beam column 10 which has control unit 12 connected thereto. Focused beam column may be an electron beam column or an ion beam column for exposure of resist or direct implantation. Control unit 12 is preferably a computer which controls the energy of the focused beam, beam steering as to position, and, where appropriate, lateral positioning of the target.

Figure 2:
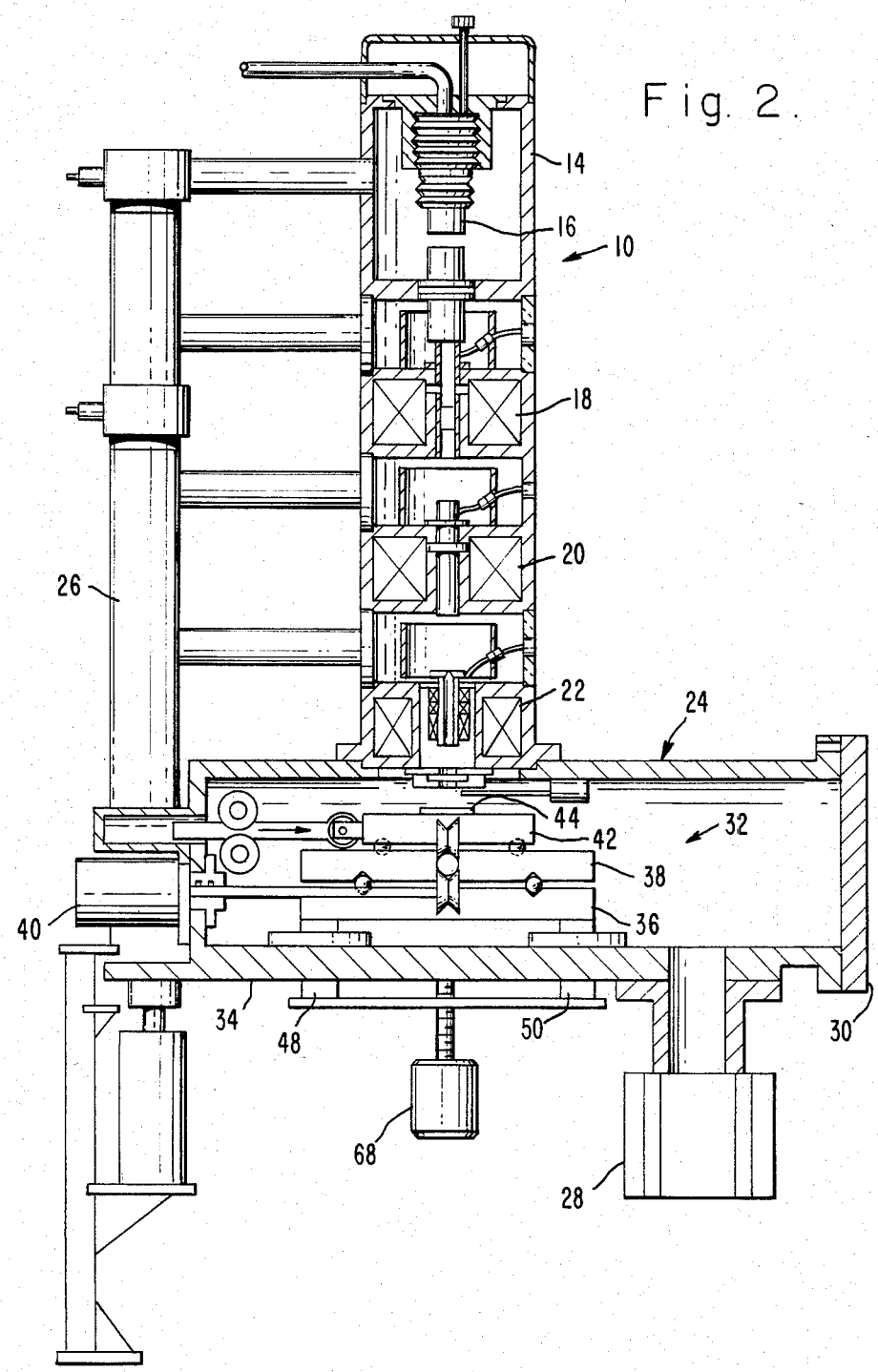
FIG. 2 is a longitudinal section through the column, with parts broken away.

FIG. 2 shows the column in more detail, with vacuum housing 14 enclosing the operative parts of the column including source 16 and lenses 18, 20 and 22. If the beam is an ion beam, an ion analyzer would be appropriate. Furthermore, beam steering is appropriate so that the beam is directed in a pattern over the target, in accordance with the desired pattern exposure.

Target chamber 24 is attached to the lower end of vacuum housing 14. Vacuum connections 26 draw the vacuum on housing 14 while vacuum pump 28 draws the vacuum on the target chamber. Flange 30 permits access to the target chamber for changing of wafers. Instead of the flange 30, a valve with an air lock chamber may be installed.

It is contemplated that in the present focused beam system the scanning pattern of the beam as driven by its computer drive and control unit 12 is not sufficient to cover an adequate area on the wafer. For this reason a two-axis positionable stage 32 is mounted on the floor 34 of target chamber 24. The two axis stage has a base plate 36 mounted with respect to floor 34. Intermediate plate 38 is mounted to move toward and away from the viewer in FIG. 2 on the top of base plate 36 and is driven by intermediate plate motor 40. The top plate is wafer support plate 42 which is movable in the left to right direction in FIG. 2. Wafer 44, mounted on wafer support plate 42, thus has movement in the X and Y coordinates, which are in the plane of the wafer 44. Refocussing of the optics in the column can bring the focus point of the beam to the surface of the wafer. This distance from the focal point to the surface of the wafer may vary due to several causes, such as mechanical or electrical changes in the column which change the focal point, wafer warpage or differences in wafer thickness. However, as previously discussed, it is more difficult to change the focal length of the optics than it is to physically change the position of the wafer with respect to the column. A height sensor attached to the bottom surface of the electron-optical column senses the distance to the wafer surface. The height sensor may be a conventional capacitive or optical sensor. The sensor output is used to control the correction system of this invention.

Figure 3:
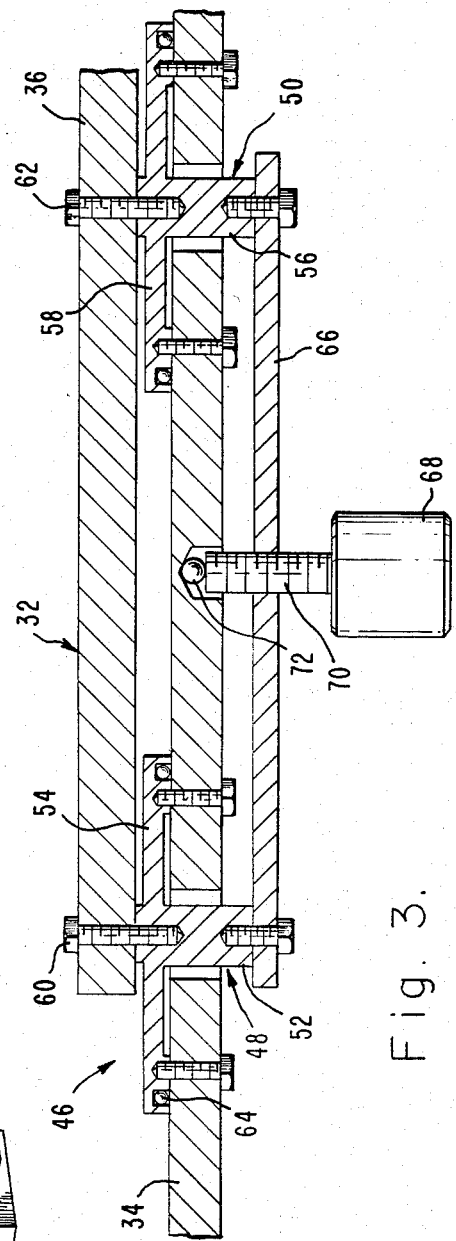
FIG. 3 is an enlarged section substantially through the support for the target, showing the first perferred embodiment of the adjustment structure for correcting wafer height in accordance with this invention.

Changing the position of the wafer with respect to the column is accomplished in the preferred embodiment by the structure illustrated in detail in FIG. 3. The floor 34 of the target chamber is illustrated, and the base plate 36 of the two axis stage 32 is adjustably positioned with respect to floor 34. This corrects the wafer height. The wafer height correction system of the first preferred embodiment of this invention is generally indicated at 46 in FIG. 3. The wafer height correction system comprises a plurality of adjustable support members, of which support members 48 and 50 are illustrated in FIG. 3. There are at least 3 support members that engage between base plate 36 and floor 34. Each support member has a stud and flange, with stud 52 and flange 54 being shown as associated with support member 48 and stud 56 and flange 58 being associated with support member 50. Base plate 36 is secured to the top of the studs, as by bolts 60 and 62, while the outer edges of the flanges 54 and 58 are secured to floor 34 by similar bolts. The underside of each flange is provide with a large circular O-ring groove having an O-ring therein, with O-ring 64 being shown with respect flange 54. The O-ring maintains vacuum integrity of the target chamber.

Flanges 54 and 58 as well as the similar flanges not shown in the other support members, are sufficiently flexible to permit vertical or Z-axis motion of base plate 36 with respect to floor 34. Mechanization of the movement of the support members can be accomplished in different ways. In the preferred embodiment of FIG. 3, pressure plate 66 engages the bottom ends of all of the studs, including studs 52 and 56. The motor 68 drives lead screw 70 which is threaded in pressure plate 70 and presses against thrust ball 72 engaged against floor 34. When lead screw 70 is right hand threaded and motor 68 rotates it in the right hand direction as seen from the motor end, lead screw 70 presses on thrust ball 72 to push down on pressure plate 66. This motion pulls down on the support members and flexes the flanges so that base plate 36 is pulled down. Such motion along the Z-axis moves the wafer away from the column for purposes of focusing. With appropriate mechanization of lead screw 70, it could instead move pressure plate 66 upward by action of the motor, or could selectively stress the flanges in either direction.

Figure 4:
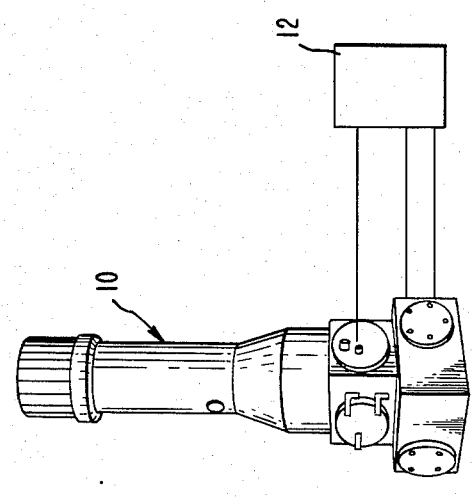
FIG. 4 is a sectional view through a second preferred embodiment of the adjustment structure for correcting wafer height in accordance with this invention.

As an alternate to flexing the flanges by mechanical means, fluid pressure means could be used as illustrated in the second preferred embodiment of the wafer height correction system as generally indicated at 74 in FIG. 4. In this system illustrated in FIG. 4, flange 76 is secured to the top of floor 34 and represents one of at least three similar flanges. Flange 76 is sealed to the floor by means of O-ring 78 which is positioned in the circular groove which extends around adjacent the periphery of flange 76. Bolts 80 and 82 hold down the periphery of flange 76, while O-ring 84 is in a groove which extends around the flange interiorly of the circle on which bolts 80 and 82 are located. Interiorly of O-ring 82 is pressure space 86. Fluid pressure connection 88 permits the introduction of pressure fluid into pressure space 86 whereupon the flange 76 bends upwards. This moves the base plate 36, which is secured to the top of the flange, upward to adjust the height of the base plate 36. Preferably, the three fluid pressure connections are connected together so that pressure is equal on each of three pressure spaces in order to substantially uniformly the lift the base plate. Control of the fluid pressure can be accomplished from the control unit.

Figure 5:
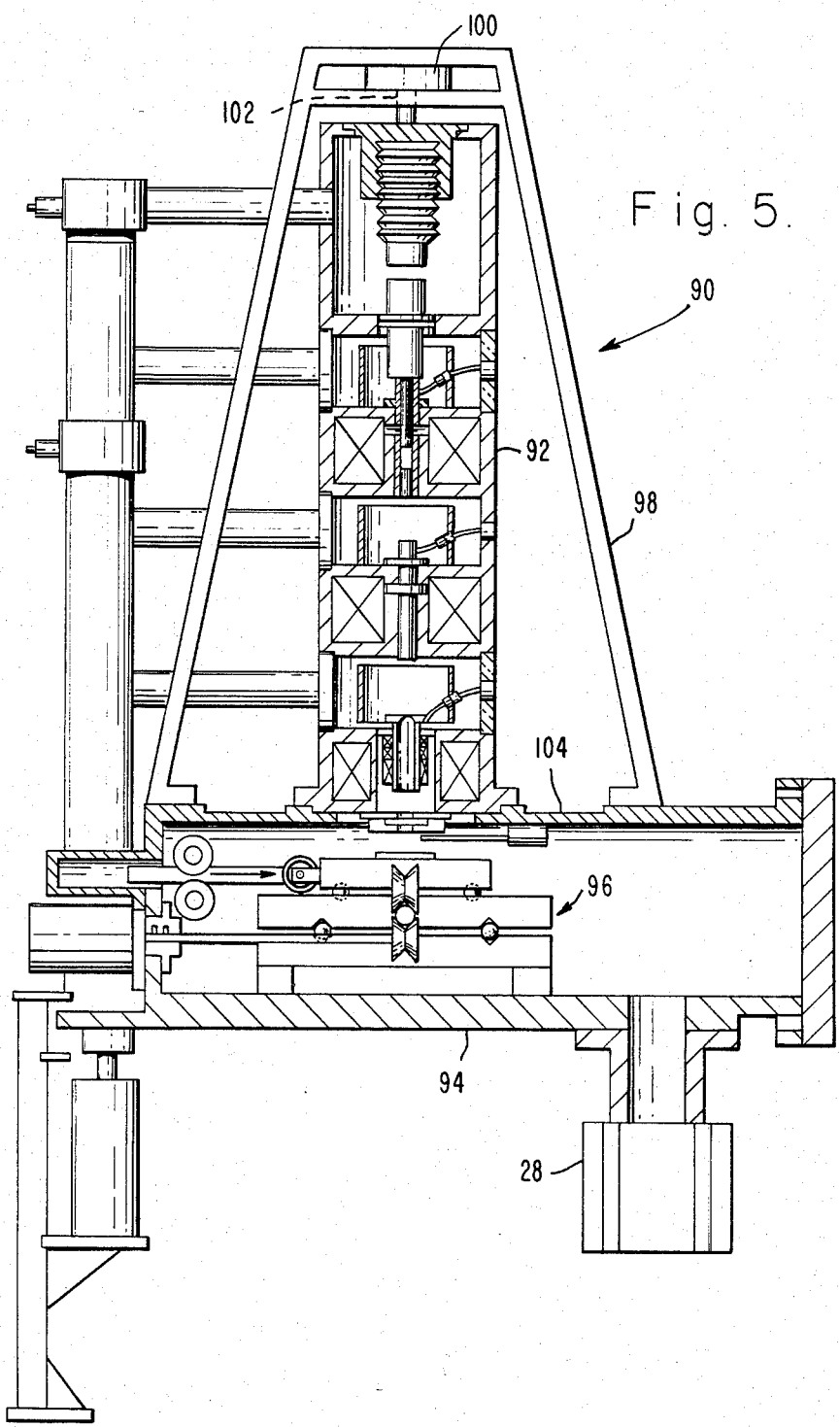
FIG. 5 is a longitudinal section through column showing a third preferred embodiment of the wafer height correction system in accordance with this invention.

A third preferred embodiment of the wafer height correction system of this invention is generally indicated at 90 in FIG. 5. The wafer height correction system is associated with focused beam column 92 with its target chamber 94, all similar to that structure in FIG. 2. Two axis stage 96 is positioned on the floor of the target chamber 94. In the case of the wafer height correction system 90, bridge 98 is secured to the top of the target chamber and extends over column 92. At its top, bridge 98 has a motor 100 which drives lead screw 102. The lead screw is engaged in a nut secured to bridge 98 and extends down to thrust against the top of column 92. With a right hand lead screw and right hand drive of the lead screw seen from the motor end, the lead screw presses column 92 down with respect to target chamber 94. The top of target chamber 94, around the mounting for column 92 and inside of bridge 92 is thin to form annular flexure diaphram 104. The motor could alternatively be a directly or indirectly acting fluid motor. Thus, the column 92 can move up and down with respect target chamber 94 so that the focal point of the column can be moved on the Z-axis with respect to the wafer. By means of these wafer height correction systems, the Z-axis position of the column with respect to the wafer support can readily adjusted and corrected.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. An adjustable height wafer support for a focused beam system wherein a column directs a focused beam into a target chamber and the target chamber has said wafer support therein for supporting a wafer in the path of the beam emitted from the column, the improvement comprising:

a flexible member between said wafer support and the column and fastened to both said wafer support and the column, together with means for flexing said flexible member to position said wafer support correctly with respect to the position of focus of the beam.

2. An adjustable height wafer support for a focused beam system wherein a column directs a focused beam into a target chamber and the target chamber has said wafer support therein for supporting a wafer in the path of the beam emitted from the column, the improvement comprising:

a flexible member between said target chamber and said wafer support and fastened to both said target chamber and said wafer support, together with means for flexing said flexible member to position said wafer support correctly with respect to the position of focus of the beam, at least part of said means for flexing being positioned outside of said target chamber.

3. The support of claim 2 wherein said target chamber has a floor and said flexible member is mounted on said floor, said wafer support also being mounted on said flexible member so that flexure of said flexible member moves said wafer support with respect to said floor of said target chamber.

4. The support of claim 3 wherein said flexible member comprises a flange having one portion thereof secured to said floor of said target chamber and another portion thereof secured with respect to said wafer support.

5. The support of claim 4 wherein said flange is circular and carries a central stud thereon, said circular flange being secured adjacent its periphery to said floor and said central stud thereon being secured with respect to said wafer support.

6. The support of claim 5 wherein said flange has a stud extending through an opening in the floor of said target chamber and motor means is connected to said stud exteriorly of said target chamber to apply force to said stud to flex said flange.

7. An adjustable height wafer support for a focused beam system wherein a column directs a focused beam into a target chamber having a floor and the target chamber has said wafer support therein on the floor of said target chamber for supporting a wafer in the parth of the beam emitted from the column, the improvement comprising:
a flexible flange having one portion thereof secured to said floor of said target chamber and another portion thereof secured with respect to said wafer support, a fluid pressure chamber between said flange and said floor of said target chamber so that introduction of fluid under pressure into said pressure chamber causes flexure of said flange to move said wafer support with respect to said floor of said target chamber, and to position said wafer support correctly with respect to the position of focus of the beam.

8. An adjustable height wafer support for a focused beam system wherein a column directs a focused beam into a target chamber and the target chamber has said wafer support therein for supporting a wafer in the path of the beam emitted from the column, the improvement comprising:
a flexible member mounted on said target chamber, means for flexing said flexible member, said wafer support being mounted on said flexible member so that flexure of said flexible member moves said wafer support with respect to said column to position said wafer support correctly with respect to the position of focus of the beam.

9. The support of claim 8 wherein said flexible support comprises a flange having one portion thereof secured to said target chamber and another portion thereof secured with respect to said wafer support.

10. An adjustable height wafer support comprising in combination:
a focused beam column for providing a focused beam to a focal plane;
a target chamber, said target chamber carrying a wafer support therein, said column being secured to said target chamber to direct the focused beam toward said wafer support; and
flexible means associated with said target chamber between said column and said wafer support for repositioning the focal plane with respect to said wafer support by flexure of said flexure means.

11. An adjustable height wafer support comprising in combination:
a focused beam column for providing a focused beam to a focal plane;
a target chamber, said target chamber carrying a wafer support therein, said column being secured to said target chamber to direct the focused beam toward said wafer support;
flexure means mounted on said target chamber, said wafer support being mounted on said flexure means for flexure of said flexure means to reposition said wafer support with respect to the focal plane in said target chamber and consequently with respect to said column.

12. The support of claim 11 wherein said flexure means has first and second relatively moveable portions comprising a substantially circular flange having a central post, one of said portions being secured to said floor of said target chamber and other of said portions being secured to said wafer support.

13. The support of claim 12 wherein a motor is connected to said flange to flex said flange to move said central post with respect to said flange to adjust position of said wafer support with respect to said floor.

14. The support of claim 13 wherein said flange is secured with respect to said floor and said wafer support is mounted on said central post, said central post extending through said floor and being acted upon by said motor means.

15. The support of claim 10 wherein said flexible means comprises a flange having a fluid space thereunder, said wafer support being mounted on said flange so that when fluid under pressure is introduced into said fluid space, said flange flexes to move said wafer support with respect to said column.

16. The support of claim 10 wherein said flexible support is formed as part of said target chamber around said column and a bridge is secured between said target chamber away from said flexible support and adjacent to said column, motor means between said bridge and said column to move said column with respect to said bridge, said wafer support being secured to said target chamber away from said support so that flexure of said flexible support moves said column with respect to said wafer support.

* * * * *